United States Patent [19]
Mabuchi et al.

[11] Patent Number: 5,788,798
[45] Date of Patent: Aug. 4, 1998

[54] PLASMA PROCESSING APPARATUS

[75] Inventors: Hiroshi Mabuchi; Takahiro Yoshiki; Naoki Matsumoto, all of Amagasaki; Kyoichi Komachi, Kobe; Shuta Kanayama, Nishinomiya; Toshiki Ebata, Osaka, all of Japan

[73] Assignee: Sumitomo Metal Industries, Ltd., Osaka, Japan

[21] Appl. No.: 605,216
[22] PCT Filed: Jul. 13, 1995
[86] PCT No.: PCT/JP95/01403
  § 371 Date: May 31, 1996
  § 102(e) Date: May 31, 1996
[87] PCT Pub. No.: WO96/03019
  PCT Pub. Date: Feb. 1, 1996

[30] Foreign Application Priority Data

Jul. 14, 1994 [JP] Japan ................. 6-162021
May 16, 1995 [JP] Japan ................. 7-117334

[51] Int. Cl.$^6$ ................................. H01L 21/00
[52] U.S. Cl. .................. 156/345; 216/69; 438/726
[58] Field of Search ..................... 156/345 MW, 156/345 ME, 643.1; 216/69; 204/298.38; 438/726, 727, 728

[56] References Cited

U.S. PATENT DOCUMENTS 5,415,719  5/1995  Akimoto .................. 156/345

FOREIGN PATENT DOCUMENTS 62-5600   of 1987  Japan.
62-99481  of 1987  Japan.
1-11403   of 1989  Japan.

OTHER PUBLICATIONS

International Search Report.

*Primary Examiner*—William Powell
*Attorney, Agent, or Firm*—Lane, Aitken & McCann

[57] ABSTRACT

A plasma processing apparatus carries out plasma processings such as etching, ashing and CVD on large substrates such as semiconductor device substrates and glass substrates for liquid crystal display panels, etc. The plasma processing apparatus having microwave generator 26, a microwave guide path 23, a microwave window 4 and a reaction room 2, etc., has a dielectric sheet 21 disposed to confront the microwave window 4 through a hollow area 20. The dielectric sheet is divided into multiple dielectric sheets 21a, 21b, and the microwave guide path 23a, 23b are connected to the divided dielectric sheets 21a, 21b. This simple structure enables the stable and uniform plasma processing on large substrates such as glass substrates for liquid crystal display panels.

6 Claims, 9 Drawing Sheets

Fig.4
Fig.5
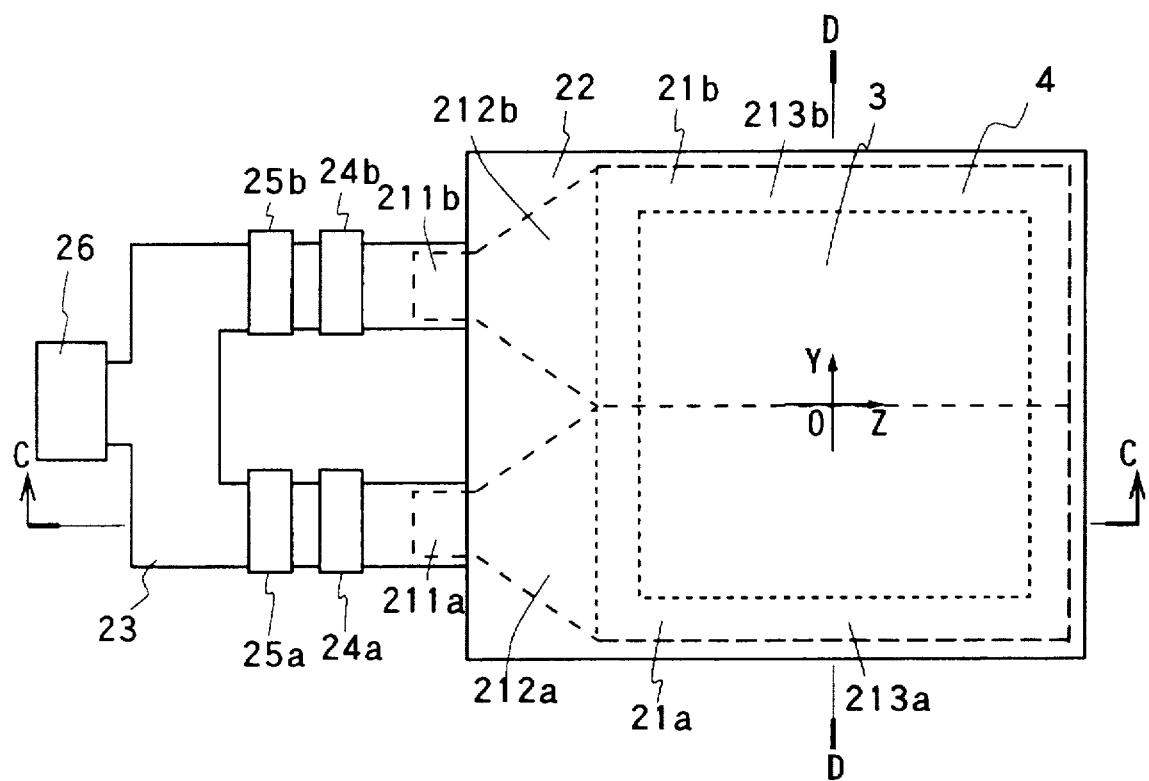
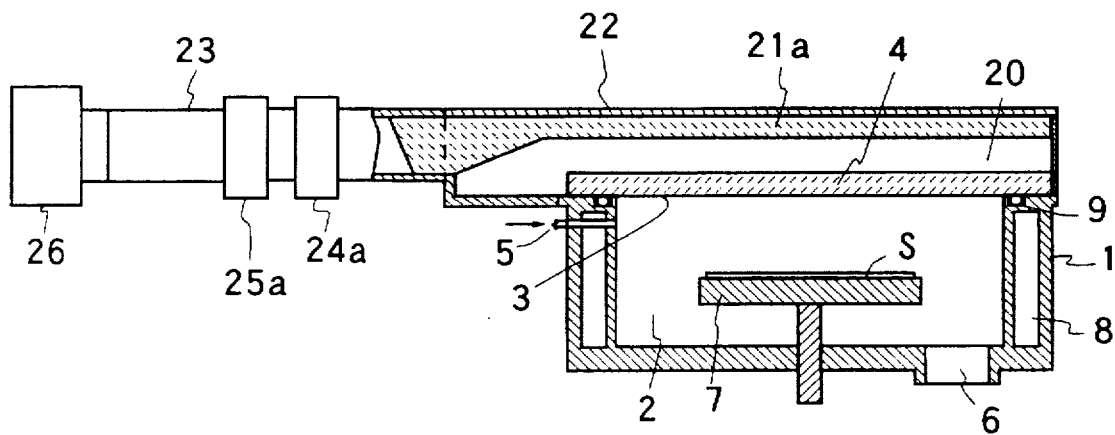

PLASMA PROCESSING APPARATUS

TECHNICAL FIELD

The present invention relates to a plasma processing apparatus which is suitable for carrying out the etching, ashing and CVD processes by using plasma on semiconductor device substrates, glass substrates for liquid crystal display (LCD) panels, and the like.

BACKGROUND ART

Plasma of reactive gas is used widely in the fabricating process of LSI and LCD devices. Particularly, the dry etching technique using plasma is an indispensable fundamental technique for the fabricating process of LSI and LCD devices.

As excitation means for generating plasma, the RF (high frequency) of 13.56 MHz is often used, and the microwave is also used recently. This is attributable to the advantages of the generation of low temperature and high-density plasma and the simplicity of the structure and operation of the apparatus.

However, it is difficult for plasma processing apparatus using the microwave to generate uniform microwave plasma over a large area, and therefore it is difficult to process large semiconductor substrates and LCD glass substrates uniformly.

In regard to this matter, the applicant of the present invention has proposed a scheme of using a dielectric sheet for a plasma processing apparatus that is capable of producing uniform microwave plasma over a large area, as disclosed in Japanese Patent Application Laid-Open No. 62-5600 and No. 62-99481.

FIG. 1, FIG. 2 and FIG. 3 are a schematic plan view, a partial cross-sectional view along the line A—A, and a partial cross-sectional view along the line B—B, respectively, of the plasma processing apparatus having the dielectric sheet proposed in the above-mentioned patent publication.

In the plasma processing apparatus shown in these figures, the microwave generated by a microwave generator 26 is directed by a microwave guide path 23 into a dielectric sheet 21. The microwave propagated in the dielectric sheet 21 forms an electric field in a hollow area 20 beneath it. The electric field penetrates a microwave window 4 and enters a reaction room 2, in which reactive gas is excited and plasma is generated. By the generated plasma, the surface of a sample S is subjected to the plasma processing.

The dielectric sheet 21 consists of an entry section 211, a fan-tailed section 212 and a flat section 213. The microwave is led from the microwave guide path 23 into the dielectric sheet 21 as follows. At the entry section 211, the microwave is led from the waveguide into the dielectric sheet. It is expanded in the transverse direction in the fan-tailed section 212. The expanded microwave is led into the flat section 213. Based on this structure, the microwave can be propagated with a uniform transverse distribution in the large flat section 213.

The plasma processing apparatus having this dielectric sheet enables the microwave to propagate uniformly to the large flat section 213, and by widening the microwave window 4 and microwave lead-in opening 3 which confront the flat section 213, it is possible to generate microwave plasma of large area in the reaction room 2.

In recent years, large glass substrates are used for LCD panels, and there are intense demands for apparatus that are capable of uniformly processing glass substrates of 400-by-400 mm or larger. Plasma processing apparatus having this dielectric sheet can generate large-area plasma by having a large dielectric sheet, microwave window and microwave lead-in opening, as mentioned above.

However, when the area of the dielectric sheet is increased steadily, the following problem will emerge. If the dielectric sheet has its width widened too much, with the fan-tailed section 212 being unchanged in length, the dielectric sheet of the fan-tailed section fans out at a large angle in the transverse direction. Therefore, the microwave cannot be expanded uniformly in the transverse direction of the dielectric sheet, resulting in a weak electric field of the microwave at the ends in the transverse direction of the dielectric sheet and an uneven distribution of plasma in the transverse direction of the dielectric sheet.

If the dielectric sheet is made too long, the electric field of the microwave diminishes sharply along the propagation direction of the microwave, resulting in an uneven distribution of plasma in the microwave propagation direction.

In order to introduce the microwave uniformly in the transverse direction of the dielectric sheet, it is necessary for the dielectric sheet of the fan-tailed section to fan out at a smaller angle. However, a smaller angle results in a longer fan-tailed section.

The reduction of the electric field strength of the microwave along the propagation direction of the microwave can be alleviated by widening the space between the dielectric sheet and the microwave window so as to weaken the coupling of the microwave and plasma. However, a weak coupling reduces the plasma density significantly and decreases the plasma processing rate.

Uneven propagation of the microwave due to an increased area of the dielectric sheet results in an uneven temperature rise caused by the absorption of the microwave at each portion of the dielectric sheet. On this account, the dielectric sheet surface has an uneven temperature distribution, which causes the deformation of dielectric sheet and deteriorates the repeatability of the plasma processing rate.

The present invention is intended to deal with the foregoing problems, and its object is to provide a plasma processing apparatus that is simple in structure and capable of carrying out the stable and uniform plasma processing on large substrates such as glass substrates for liquid crystal display (LCD) panels.

DISCLOSURE OF THE INVENTION

The inventive plasma processing apparatus has its dielectric sheet, which confronts the microwave window, divided into multiple sheets, with the divided dielectric sheets being connected to one or more microwave generators through a microwave guide path(s). Based on this structure, each dielectric sheet to which the microwave is introduced by a microwave guide path can have a smaller area, and consequently the microwave can have a uniform electric field distribution.

FIG. 4, FIG. 8 and FIG. 12 show examples of apparatus having their dielectric sheet divided in the transverse direction. The detailed structure of the apparatus will be explained later. As shown in the figures, the dielectric sheet is divided in the transverse direction and the microwave is introduced to each divided section, and consequently the microwave can be introduced uniformly in the transverse direction of the dielectric sheet without making the fan-tailed section of the dielectric sheet longer. In addition, the microwave propagation area decreases, and the reduction of the electric field strength of the microwave along the propagation direction can be alleviated.

FIG. 14 shows an example of an apparatus having its dielectric sheet divided in the microwave propagation direction, and the detailed structure of the apparatus will be explained later. By dividing the dielectric sheet in the microwave propagation direction and introducing the microwave into each divided section, the microwave propagation distance can be reduced and the reduction of the electric field strength of the microwave along the propagation direction can be alleviated. In addition, the microwave propagation area decreases, and the reduction of the electric field strength of the microwave at the end in the transverse direction of the dielectric sheet can be alleviated.

Any of the above-mentioned cases can achieve the uniform propagation of the microwave in the dielectric sheet, and the deformation of dielectric sheet and the aggravation of the repeatability of plasma processing caused by the uneven temperature distribution on the dielectric sheet surface can be prevented.

As shown in FIG. 8, FIG. 12 and FIG. 14 in the cases of dividing the dielectric sheet, the interference of the microwave propagated in each dielectric sheet can be alleviated by separating the divided dielectric sheets by means of metallic plates. Based on this structure, even if the plasma generation condition, e.g., the gas flow rate or the internal pressure of reaction room, is varied, the microwave propagation does not vary significantly. Plasma can be generated stably within the prescribed range of the plasma generation condition.

As shown in FIG. 4, FIG. 8 and FIG. 12, by dividing the dielectric sheet in the transverse direction and introducing the microwave to each divided section, it is no longer necessary for the fan-tailed section of the dielectric sheet to have a small angle, so the fan-tailed section can be shortened. Consequently, the apparatus can be prevented from becoming large.

As shown in FIG. 4 and FIG. 8, by connecting a microwave generator to the divided multiple dielectric sheets by means of a microwave guide path having branches so that the microwave is propagated by branching, the need of providing multiple microwave generators is eliminated and the cost of apparatus can be reduced.

As shown in FIG. 12 and FIG. 14, by providing independent microwave guide paths and microwave generators for the divided dielectric sheets individually, the need of the microwave branching section of the microwave guide path can be eliminated and the structure of the apparatus can be simplified.

BRIEF EXPLANATION OF THE DRAWING

FIG. 4 is a schematic plan view of the plasma processing apparatus based on a first embodiment of this invention, FIG. 5 is a partial cross-sectional view along the line C—C of the plasma processing apparatus of the first embodiment of invention.

BEST MODE FOR CARRYING OUT THE INVENTION

First Embodiment

Figure 1:
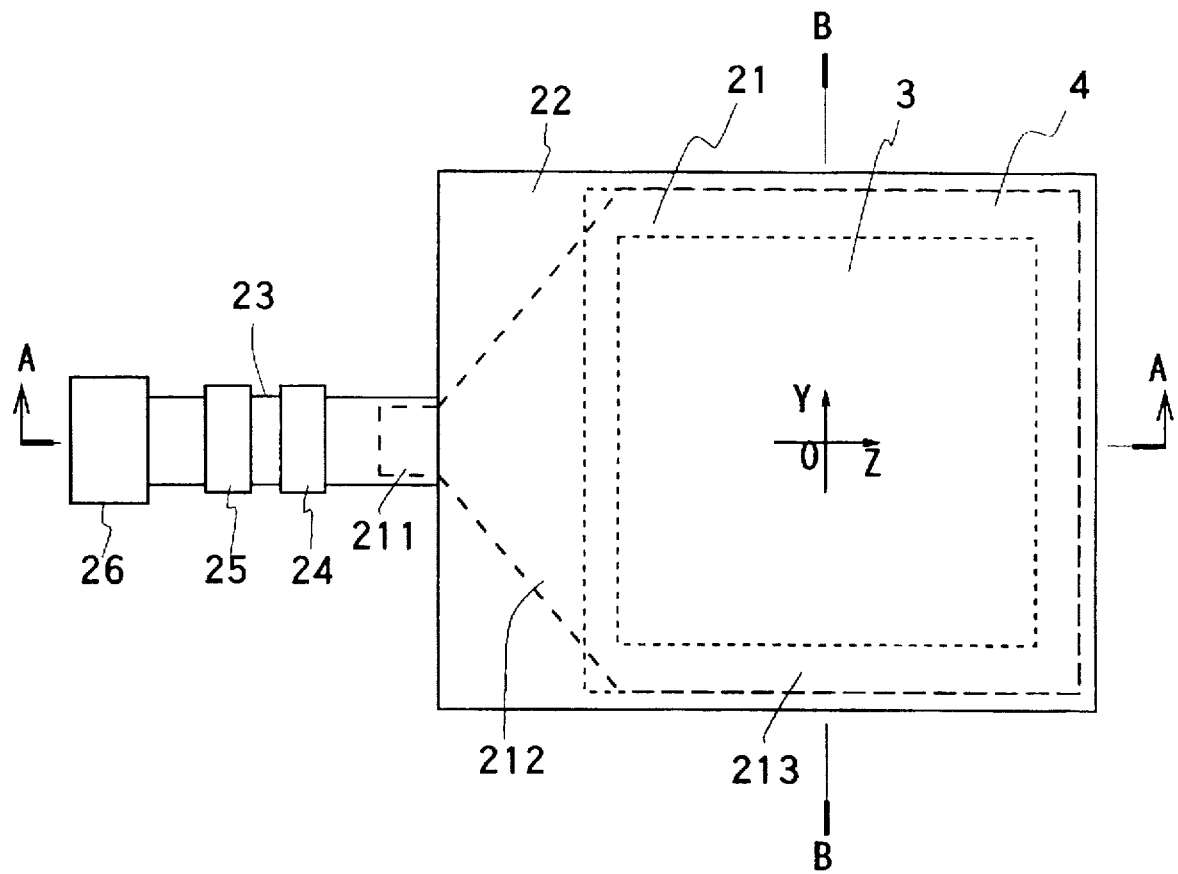
FIG. 1 is a schematic plan view of the conventional plasma processing apparatus.

The present invention will be explained specifically with reference to the drawings showing the first embodiment of invention.

FIG. 4 is a schematic plan view of the plasma processing apparatus of the first embodiment. This embodiment is intended to divide the dielectric sheet in two parts in its transverse direction.

Introduction of the microwave into the dielectric sheet will be explained. A microwave guide path 23 is formed of a waveguide. Provided amid the microwave guide path 23 is a microwave distributor (not shown), which supplies the same amount of microwave into two guide paths. The microwave guide path 23 connects a microwave generator 26 to the divided dielectric sheets 21a and 21b. The two dielectric sheets 21a and 21b are covered on their upper surface with a metallic plate 22. The dielectric sheets 21a and 21b are made of fluororesin such as teflon (registered trademark). The metallic plate 22 is made of aluminum or the like.

Provided amid the microwave guide path 23 are tuners 24a and 24b which make matching of the microwave. Further provided are isolators 25a and 25b which remove the reflected microwave. By providing the tuners and isolators on the guide path which is connected to the dielectric sheets 21a and 21b, it is possible to adjust the matching of individual dielectric sheets independently and eliminate the adverse influence of the respective reflected waves.

The microwave generated by the microwave generator 26 branches into two amid the microwave guide path 23, and introduced into the dielectric sheets 21a and 21b. The microwaves are introduced at the entry sections 211a and 211b from the waveguides into the dielectric sheets, expanded in the transverse direction in fan-tailed sections 212a and 212b, and introduced into flat sections 213a and 213b. As a result, the microwaves are propagated uniformly in the flat sections 213a and 213b which confront the microwave window 4.

FIG. 5 is a partial cross-sectional view taken along the line C—C of the plasma processing apparatus of the first embodiment. The reaction chamber and the disposition of the reaction chamber and dielectric sheet will be explained.

The reaction chamber 1 having a shape of rectangular box is made of metal such as aluminum (Al). Formed inside the reaction chamber 1 is a reaction room 2. A microwave lead-in opening 3 is formed at the top of the reaction chamber 1. The microwave lead-in opening 3 is sealed airtight with an O-ring 9 which is interposed between the microwave window 4 and the upper wall of the reaction chamber 1. The microwave window 4 has thermal durability and microwave transmissibility, and is made of a material having small dielectric loss, e.g., quartz glass ($SiO_2$), alumina ($Al_2O_3$), or the like.

Disposed inside the reaction room 2 at the position confronting the microwave window 4 is a sample stage 7 for mounting a sample S. There are provided a gas inlet 5 for supplying the reactive gas and an evacuation port 6 which is connected to an evacuation device (not shown). Formed in a peripheral wall of the reaction chamber 1 is a medium passage 8, in which the medium at a prescribed temperature circulates so that the peripheral walls of the reaction chamber 1 is maintained at a prescribed temperature. A gate valve (not shown) for transferring in and out a sample S to/from the reaction room 2 is formed in the side wall of the reaction chamber 1.

The dielectric sheets 21a and 21b (not shown) are disposed to confront the microwave window 4 thereby to cover the microwave window 4 through a hollow area 20.

Figure 6:
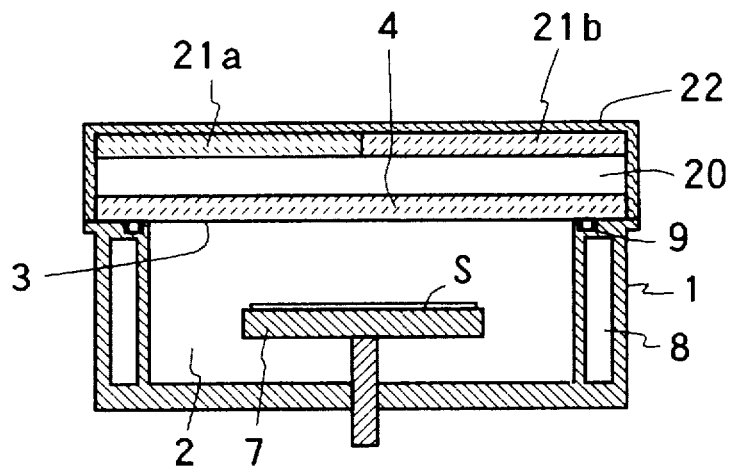
FIG. 6 is a cross-sectional view along the line D—D of the plasma processing apparatus of the first embodiment of invention.

FIG. 6 is a schematic cross-sectional view taken along the line D—D of the plasma processing apparatus of the first embodiment. The dielectric sheets 21a and 21b are disposed in parallel to confront the microwave window 4.

The apparatus of this embodiment has a plasma generation area of 500-by-500 mm. The dimensions and materials of the major parts of the apparatus are as follows. The microwave lead-in opening 3 is dimensioned by 500-by-500 mm, and the microwave window 4 is made of a quartz plate of 600-by-600 mm having a thickness of 20 mm. The dielectric sheets 21a and 21b have their flat sections 213a and 213b each dimensioned by 600-by-300 mm, and are made of teflon having a thickness of 20 mm.

The method of plasma processing by use of the plasma processing apparatus of this embodiment on the surface of a sample S which is placed on the sample stage will be explained.

The medium at the prescribed temperature is run to circulate in the medium passage 18. The reaction room 2 is evacuated through the evacuation port 6 until the prescribed pressure, and thereafter the reactive gas is supplied through the gas inlet 5 formed in the peripheral wall to establish the prescribed pressure in the reaction room 2.

The microwave generator 26 is operated to generate the microwave, and the generated microwave is introduced into the dielectric sheets 21a and 21b by branching into two guide paths amid the microwave guide path 23. By the microwave propagated in the dielectric sheets 21a and 21b, an electric field is formed in the hollow area 20 below the dielectric sheets. The electric field passes through the microwave windows 4, and it is supplied to the reaction room 2 to generate plasma. The surface of the sample S is subjected to plasma processing by this plasma.

For the evaluation of the uniformity of plasma generated by the plasma processing apparatus of this embodiment, the distribution of ion current density was measured. The measurement was conducted in the Z-direction which is the microwave propagation direction and the Y-direction perpendicular to it around the center of the sample stage. The measuring position was at a distance of 100 mm from the microwave window. Plasma generation was based on the use of Ar gas at a pressure of 10 mTorr and at a microwave power of 3 kW.

A probe of disc electrode of 2.0 mm in diameter made of stainless steel was used to measure the ion current density. With a d.c. voltage of −50 V being applied to the probe against the reaction chamber wall, a current i flowing into the probe was measured. The ion current density was calculated by dividing the magnitude of current i by the area of electrode of the probe.

Figure 7:
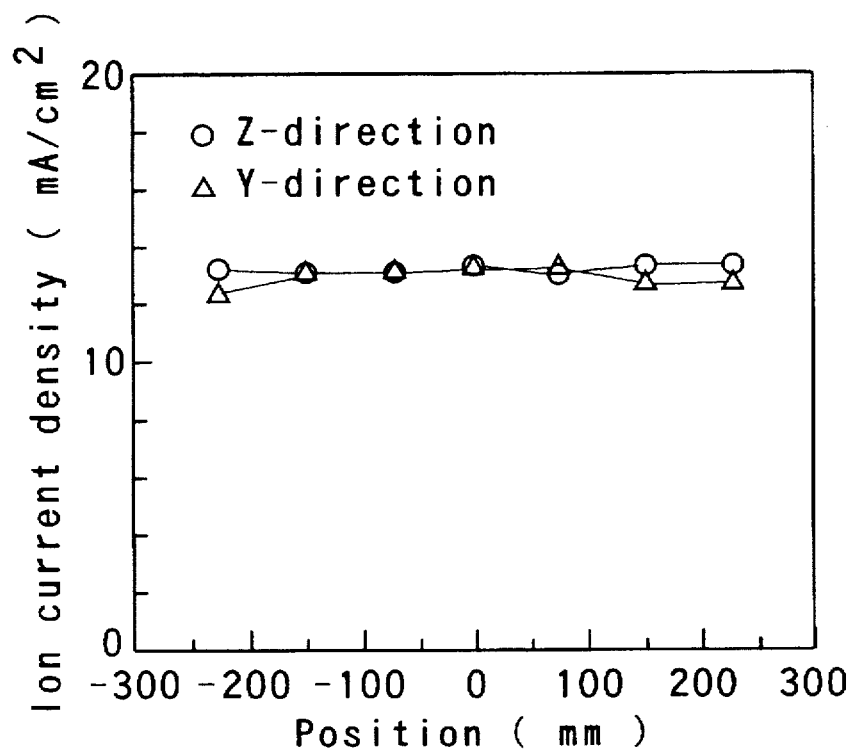
FIG. 7 is a graph showing the result of measurement of the ion current density distribution for the plasma processing apparatus of the first embodiment of invention.

FIG. 7 is a graph showing the measurement result of the ion current density distribution of this embodiment. FIG. 7 reveals that plasma was generated virtually uniformly. Not only was plasma generated uniformly in the Y-direction, but it was also generated uniformly in the Z-direction.

Second Embodiment

Figure 8:
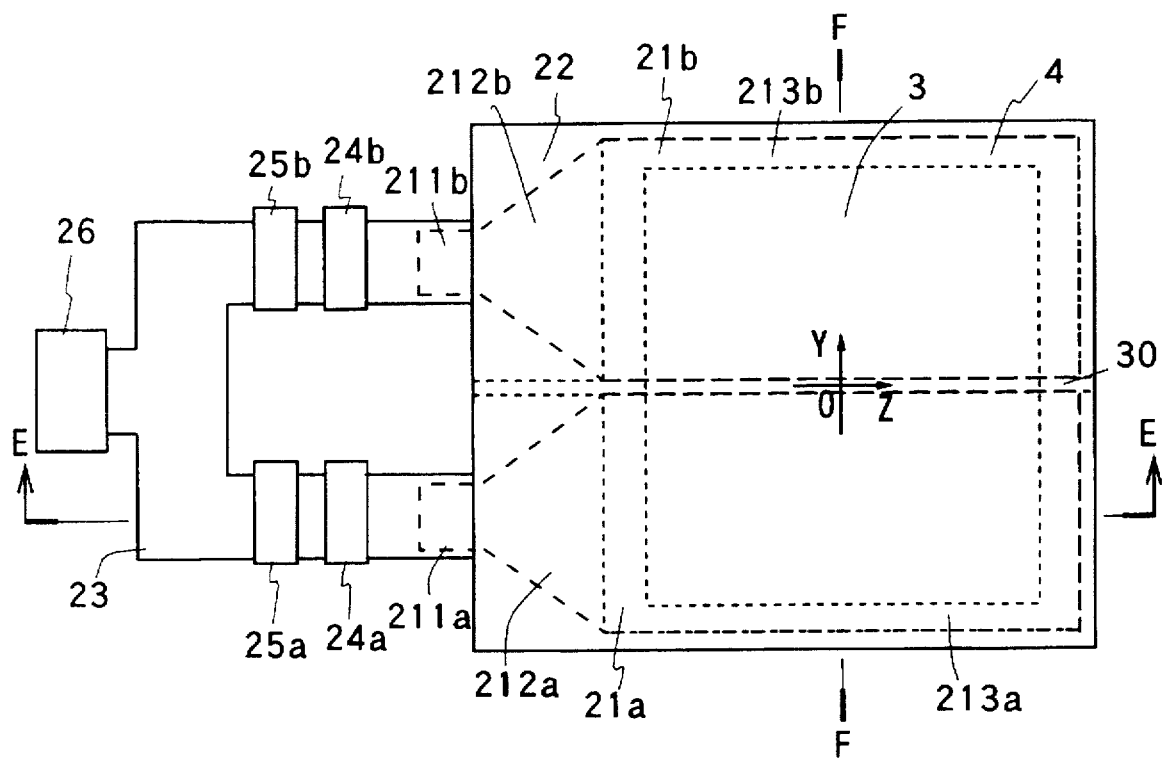
FIG. 8 is a schematic plan view of the plasma processing apparatus based on a second embodiment of this invention.
Figure 9:
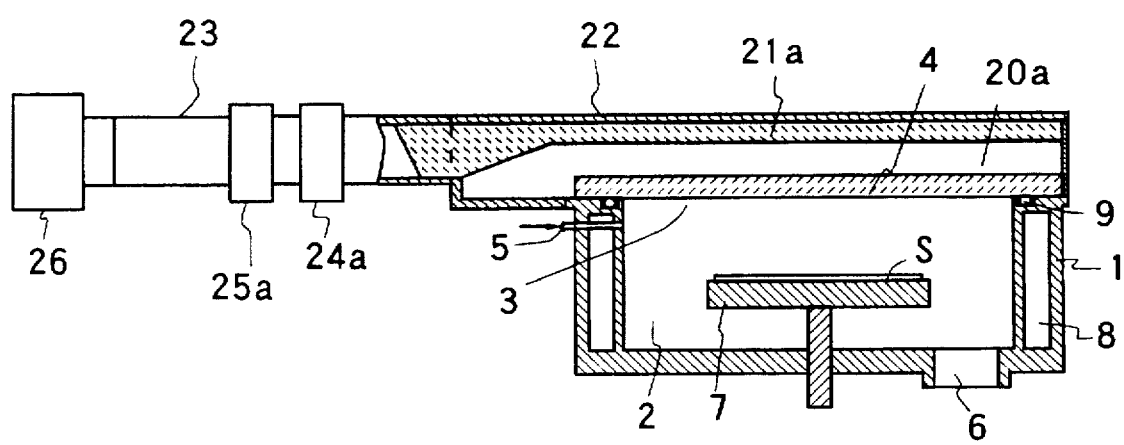
FIG. 9 is a partial cross-sectional view along the line E—E of the plasma processing apparatus of the second embodiment of invention.
Figure 10:
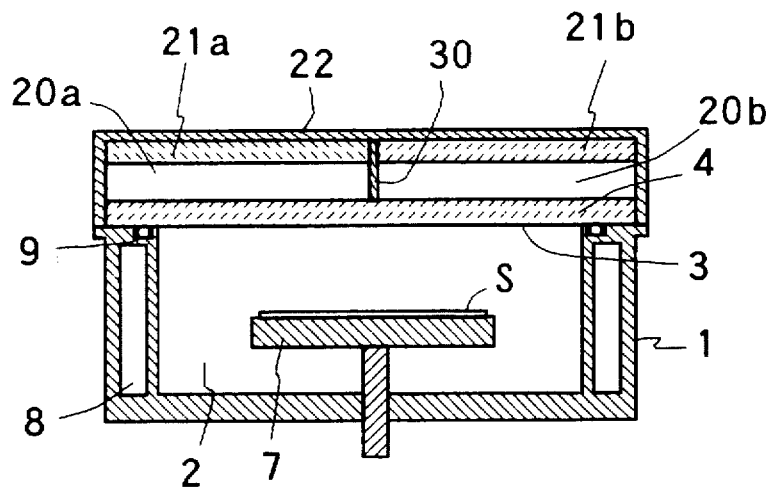
FIG. 10 is a cross-sectional view along the line F—F of the plasma processing apparatus of the second embodiment of invention.

FIG. 8, FIG. 9 and FIG. 10 are a schematic plan view, a partial cross-sectional view along the line E—E, and a partial cross-sectional view along the line F—F of the plasma processing apparatus of the second embodiment of this invention.

This embodiment is different from the first embodiment only in that the dielectric sheet is divided into dielectric sheets 21a and 21b and the hollow area is divided into hollow areas 20a and 20b by a metallic wall 30. Due to the separation of the dielectric sheets 21a and 21b by the metallic wall 30, the microwave is propagated in each of the dielectric sheets 21a and 21b independently. Accordingly, the interference of the microwaves propagated in the dielectric sheets 21a and 21b is alleviated.

Introduction of the microwave into the dielectric sheets 21a and 21b and generation of plasma are identical to the first embodiment. The microwave generated by the microwave generator 26 branches into two guide paths amid the microwave guide path 23, and is introduced into the dielectric sheets 21a and 21b. By the microwaves propagated in the dielectric sheets 21a and 21b, electric fields are formed in the hollow areas 20a and 20b. These electric fields pass through the microwave window 4 into the reaction room 2, and plasma is generated.

The apparatus of this embodiment has its plasma generation area dimensioned by 500-by-500 mm, and the dimensions and materials of the major parts of the apparatus are as follows. The microwave lead-in opening 3 is dimensioned by 500-by-500 mm, and the microwave window 4 is made of a quartz plate of 600-by-600 mm having a thickness of 20 mm. The dielectric sheets 21a and 21b have their flat sections 213a and 213b each dimensioned by 600-by-297 mm, and are made of teflon having a thickness of 20 mm. The metallic wall 30 is made of aluminum (Al) of 6 mm in width.

For the evaluation of the uniformity of plasma generated by the plasma processing apparatus of this embodiment, the distribution of ion current density was measured in the same manner as the first embodiment. The measurement was conducted in the Z-direction which is the microwave propagation direction and the Y-direction perpendicular to it arounde the center of the sample stage. The measuring position was at a distance of 100 mm from the microwave window. Plasma generation was based on the use of Ar gas at a pressure of 10 mTorr and at a microwave power of 3 kW as in the first embodiment.

Figure 11:
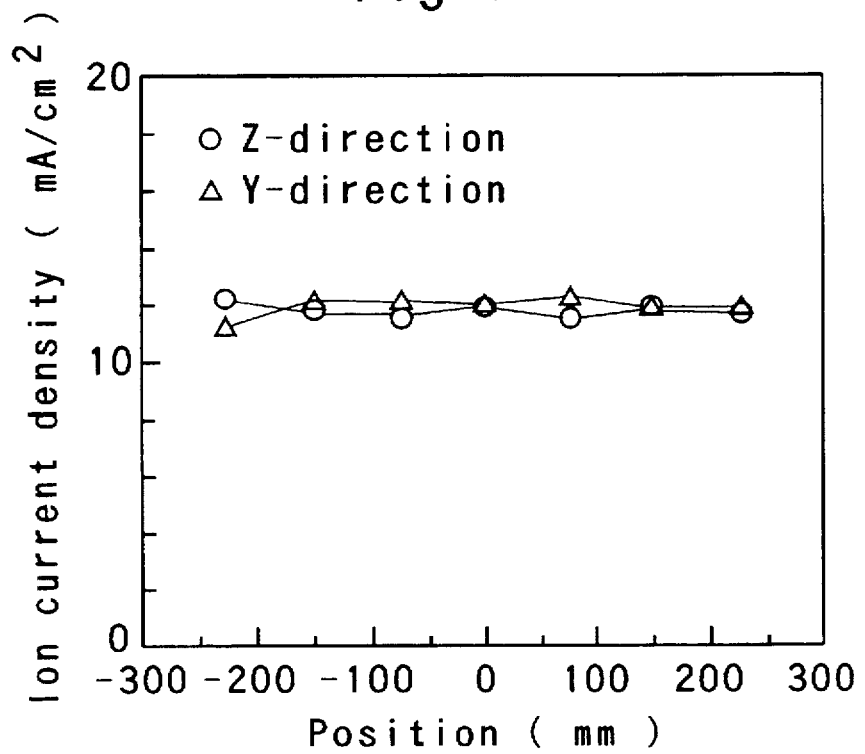
FIG. 11 is a graph showing the result of measurement of the ion current density distribution for the plasma processing apparatus of the second embodiment of invention.

FIG. 11 is a graph showing the measurement result of the ion current density distribution of this embodiment. Plasma was generated virtually uniformly as in the first embodiment.

Third Embodiment

Figure 12:
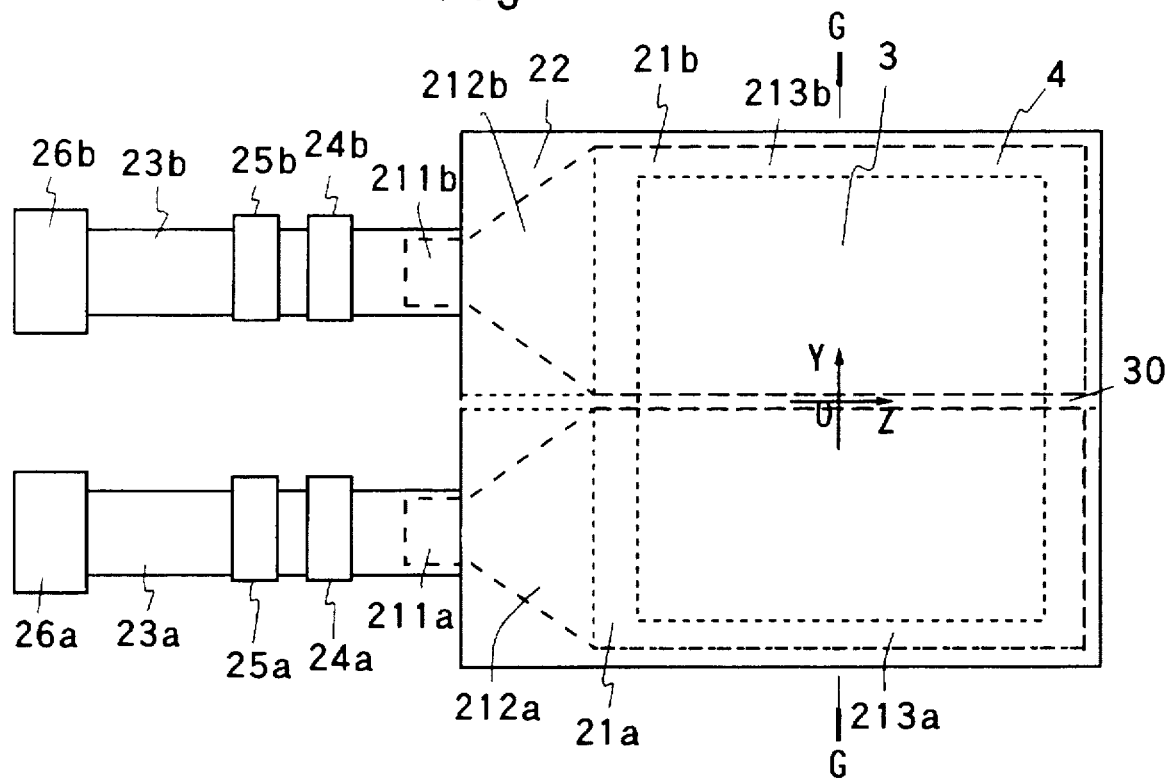
FIG. 12 is a schematic plan view of the plasma processing apparatus based on a third embodiment of this invention.
Figure 13:
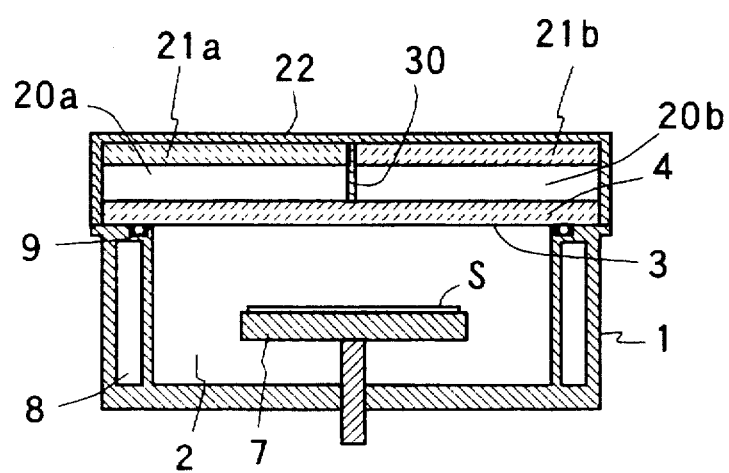
FIG. 13 is a partial cross-sectional view along the line G—G of the plasma processing apparatus of the third embodiment of invention.

FIG. 12 and FIG. 13 are a schematic plan view and a partial cross-sectional view along the line G—G of the plasma processing apparatus of the third embodiment of this invention. This embodiment is different from the first embodiment only in that a microwave generator 26a and microwave guide path 23a are provided for the dielectric sheet 21a, and a microwave generator 26b and microwave guide path 23b are provided for the dielectric sheet 21b.

The microwave generated by the microwave generator 26a is introduced to the divided dielectric sheet 21a by way of the microwave guide path 23a. Similarly, the microwave generated by the microwave generator 26b is introduced to the divided dielectric sheet 21b by way of the microwave guide path 23b. By the microwaves propagated in the dielectric sheets 21a and 21b, electric fields are formed in the hollow areas 20a and 20b below them. These electric fields pass through the microwave window 4 into the reaction room 2, and plasma is generated.

Fourth Embodiment

Figure 14:
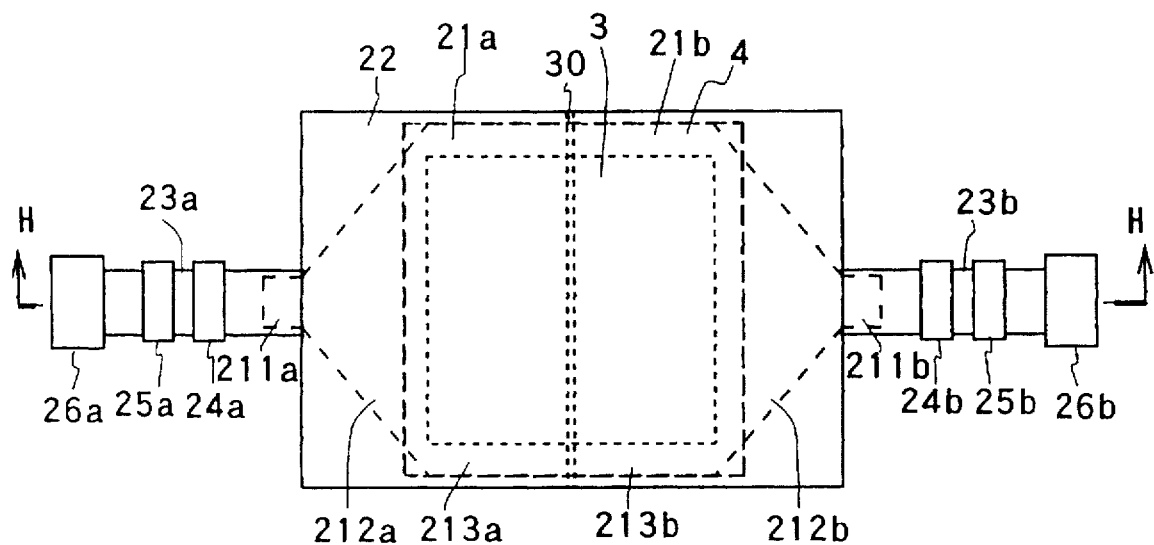
FIG. 14 is a schematic plan view of the plasma processing apparatus based on a fourth embodiment of this invention.
Figure 15:
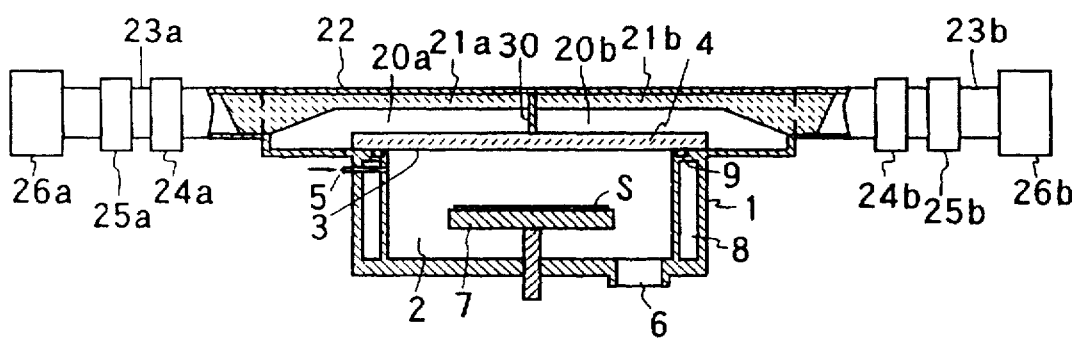
FIG. 15 is a partial cross-sectional view along the line H—H of the plasma processing apparatus of the fourth embodiment of invention.

FIG. 14 and FIG. 15 are a schematic plan view and a partial cross-sectional view along the line H—H of the plasma processing apparatus of the fourth embodiment of this invention.

This embodiment is intended to divide the dielectric sheet into two parts in the microwave propagation direction. The dielectric sheet is divided into dielectric sheets 21a and 21b and the hollow area is divided into hollow areas 20a and 20b.

The microwave generated by the microwave generator 26a is introduced to the divided dielectric sheet 21a by way of the microwave guide path 23a. Similarly, the microwave generated by the microwave generator 26b is introduced to the divided dielectric sheet 21b by way of the microwave guide path 23b. By the microwaves propagated in the dielectric sheets 21a and 21b, electric fields are formed in the hollow areas 20a and 20b below them. These electric fields pass through the microwave window 4 into the reaction room 2, and plasma is generated.

Comparative Example

Figure 2:
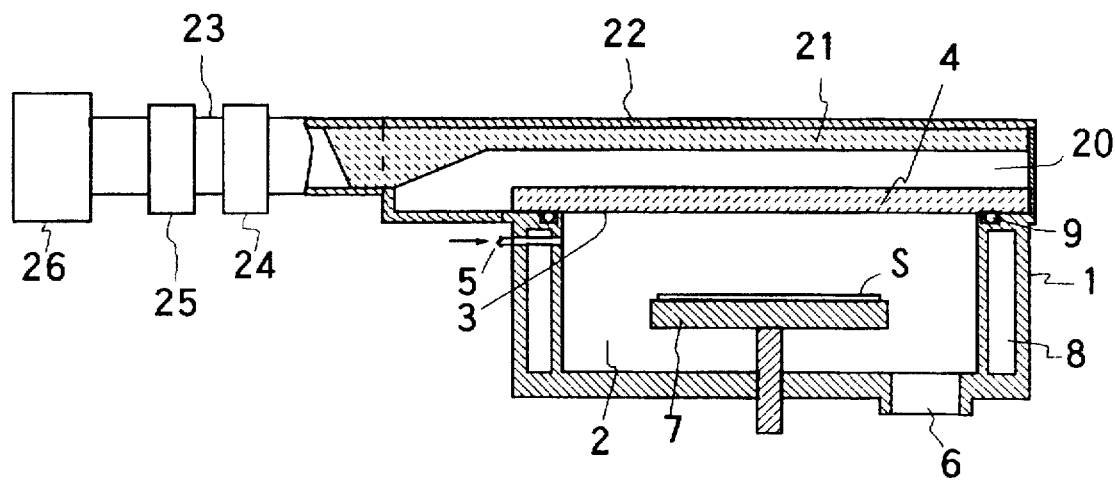
FIG. 2 is a partial cross-sectional view along the line A—A of the conventional plasma processing apparatus.
Figure 3:
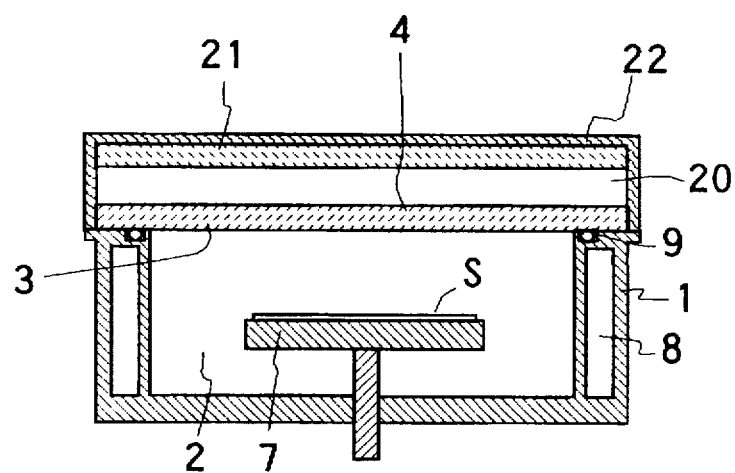
FIG. 3 is a cross-sectional view along the line B—B of the conventional plasma processing apparatus.

FIG. 1, FIG. 2 and FIG. 3 are a schematic plan view, a partial cross-sectional view along the line A—A, and a cross-sectional view along the line B—B of a conventional plasma processing apparatus. The structure and the operating method of the apparatus shown in these figures are as described previously.

The apparatus of this comparative example has a plasma generation area of 500-by-500 mm. The dimensions and materials of the major parts of the apparatus are as follows. The microwave lead-in opening 3 is dimensioned by 500-by-500 mm, and the microwave window 4 is made of a quartz plate of 600-by-600 mm having a thickness of 20 mm. The dielectric sheet 21 has its flat sections 213 dimensioned by 600-by-300 mm, and is made of teflon having a thickness of 20 mm.

For the evaluation of the uniformity of plasma generated by this conventional plasma processing apparatus, the distribution of ion current density was measured. The measurement was conducted in the Z-direction which is the microwave propagation direction and the Y-direction perpendicular to it around the center of the sample stage.

The measuring position was at a distance of 100 mm from the microwave window. Plasma generation was based on the use of Ar gas at a pressure of 10 mTorr and at a microwave power of 3 kW.

Figure 16:
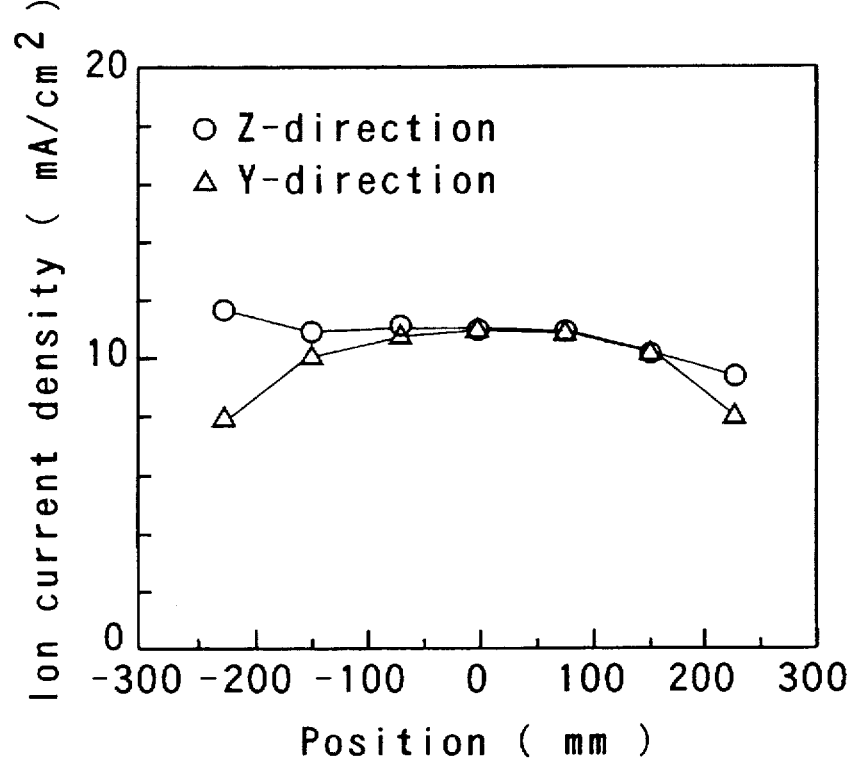
FIG. 16 is a graph showing the result of measurement of the ion current density distribution for the conventional plasma processing apparatus.

FIG. 16 is a graph showing the measurement result of the ion current density distribution of this comparative example. FIG. 16 reveals that the ion current density decreases at the end of the Y-axis which is the transverse direction of the dielectric sheet 21. The ion current density is high on the entry side and decreases gradually in the Z-direction which is the microwave propagation direction. Accordingly, the uniformity of plasma distribution was insufficient.

Industrial Applicability

The inventive apparatus which is simple in structure is capable of generating plasma uniformly in a large area. Therefore, it can carry out plasma processings such as etching, ashing and CVD stably and uniformly on large substrates such as semiconductor device substrates and glass substrates for liquid crystal display panels.

We claim:

1. A plasma processing apparatus comprising a microwave generator, a microwave guide path for propagating a microwave, a dielectric sheet connected to said microwave guide path, a microwave window disposed to confront said dielectric sheet through a hollow area, and a metallic reaction chamber having its microwave lead-in opening sealed airtight with said microwave window, characterized in that said dielectric sheet is divided into multiple dielectric sheets and said microwave guide path is connected to said divided dielectric sheets.

2. A plasma processing apparatus according to claim 1, characterized in that said divided multiple dielectric sheets are separated from each other by a metallic wall.

3. A plasma processing apparatus according to claim 1, characterized in that said dielectric sheet is divided in the transverse direction thereof into multiple dielectric sheets.

4. A plasma processing apparatus according to claim 1, characterized in that said microwave generator is a unitary microwave generator and said apparatus includes a microwave guide path which causes the microwave from said unitary microwave generator to branch and to be propagated to said multiple dielectric sheets.

5. A plasma processing apparatus according to claim 1, characterized in that said apparatus includes microwave guide paths and microwave generators provided independently for said divided multiple dielectric sheets.

6. A plasma processing apparatus according to claim 1, characterized in that said divided dielectric sheets are two in number.

* * * * *